United States Patent [19]

Spielman et al.

[11] Patent Number: 5,283,526
[45] Date of Patent: Feb. 1, 1994

[54] METHOD FOR PERFORMING SINGLE AND MULTIPLE SLICE MAGNETIC RESONANCE SPECTROSCOPIC IMAGING

[75] Inventors: Daniel M. Spielman, San Jose; John M. Pauly, Menlo Park, both of Calif.

[73] Assignee: Board of Trustees of the Leland Stanford Junior University, Stanford, Calif.

[21] Appl. No.: 908,098

[22] Filed: Jul. 1, 1992

[51] Int. Cl.⁵ .............................................. G01R 33/20
[52] U.S. Cl. ..................... 324/309; 324/307
[58] Field of Search ................... 324/307, 309, 300; 128/653.2

[56] References Cited

U.S. PATENT DOCUMENTS

| | | | |
|---|---|---|---|
| 4,689,564 | 8/1987 | Leue et al. | 324/312 |
| 4,999,580 | 3/1991 | Meyer et al. | 324/309 |
| 5,070,876 | 12/1991 | Wright | 324/306 |
| 5,105,152 | 4/1992 | Pauly et al. | 324/309 |
| 5,151,655 | 9/1992 | Harms et al. | 324/309 |
| 5,189,371 | 2/1993 | Conolly et al. | 324/309 |

OTHER PUBLICATIONS

A Linear Class of Large Tip Angle Selective Excitation Pulses, Pauly et al., Jour. of Mag. Resn 82, 571–587 (1989).

Daniel M. Spielman et al., Lipid-suppressed Single- and Multisection Proton Spectroscopic Imaging of the Human Brain, (1992) JMRI 253–262.

D. Spielman et al., Inversion Recovery Methods for Lipid Suppression in H Brain Spectroscopic Imaging, (1991) SMRM Book of Abrstracts, vol. 1., 467.

Primary Examiner—Michael J. Tokar
Assistant Examiner—Raymond Y. Mah
Attorney, Agent, or Firm—Townsend and Townsend Khourie and Crew

[57] ABSTRACT

A new pulse sequence which uses inversion recovery for lipid suppression and a spectral-spatial refocusing pulse for water suppression in spectroscopic imaging of the brain. In contrast to methods which eliminate fat by restricting the excited volume to lie completely within the brain, inversion recovery techniques allow imaging of an entire slice without such restrictions. A spectral-spatial pulse provides water suppression insensitive to a reasonable range of $B_0$ and $B_1$ inhomogeneities. Metabolite maps covering large volumes of the human brain can be produced with images from single and multiple slices obtained.

11 Claims, 19 Drawing Sheets

METHOD FOR PERFORMING SINGLE AND MULTIPLE SLICE MAGNETIC RESONANCE SPECTROSCOPIC IMAGING

The U.S. government has rights in the claimed invention pursuant to NIH grant No. CA48269.

BACKGROUND OF THE INVENTION

This invention relates generally to magnetic resonance imaging (MRI), and more particularly the invention relates to spectroscopic imaging of the brain, for example, while suppressing interfering lipid signals and water signals.

Magnetic resonance imaging (MRI) is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radiofrequency signals resulting from the precession of these spins are received using pickup coils. By manipulating the magnetic fields, an array of signals is provided representing different regions of the volume. These are combined to produce a volumetric image of the nuclear spin density of the body.

Numerous studies have shown that $^1H$ spectroscopic imaging can potentially provide valuable clinical information for diagnosing and evaluating metabolic processes in normal and diseased brain. However, a number of technical difficulties must be overcome. Water suppression throughout a large region of interest (ROI) is difficult due to both $B_0$ and $B_1$ inhomogeneities. In addition, intense lipid signals from subcutaneous fat surrounding the skull must be eliminated to avoid overwhelming the much smaller desired metabolite signals.

Known successful techniques for spectroscopic imaging use a series of spatially selective RF pulses (one along each spatial axis) to excite a rectangular region which is carefully positioned to lie wholly within the brain. The excited ROI is then phase encoded along two axes to generate a 3-dimensional data set which can be processed to form images of the various metabolites. Without the ROI restrictions, the relatively coarse locations provided by the phase encoding is typically insufficient to prevent unwanted fat signals from severely contaminating the desired spectra, even for voxels deep within the brain.

While limiting the ROI to an interior volume is an effective method of fat suppression, there are a number of limitations. Locating a rectangular ROI within the skull involves a fundamental tradeoff between the achievable lipid suppression and the size of the excited volume. While a large ROI is desirable, care must be taken to keep the edges of the volume away from the skull. Thus, examining regions close to the skull is particularly difficult and usually requires a significantly smaller ROI. One alternative prior art method uses multidimensional pulses to excite an elliptical ROI which fits more easily within the skull. However, any method which uses spatially selective RF pulses to eliminate the subcutaneous fat will suffer from imperfect slice profiles and finite slice transition widths.

SUMMARY OF THE INVENTION

The present invention provides selective spectroscopic imaging in an entire two dimensional slice through the brain or other object. Inversion recovery is utilized to suppress lipid signals by exploiting the spin-lattice relaxation times (T1) of lipids and metabolites such as NAA, lactate, creatine and choline. By adjusting the inversion time, TI, to null lipids, significant fat suppression can be produced with only modest reduction in desired metabolite signals.

Water suppression is achieved by using a spectral-spatial 180° RF pulse. In accordance with a preferred embodiment, a non-linear phase RF pulse such as a minimum phase RF pulse is utilized for the spectral-spatial selection in which a sub-pulse envelope determines spectral profile and the shape of the sub-pulses determines spatial response.

In accordance with another feature of the invention, multislice imaging is efficiently performed since all pulses are selective along the same axis.

The invention and objects and features thereof will be more fully understood from the following detailed description and appended claims when taken with the drawings.

DESCRIPTION OF SPECIFIC EMBODIMENTS

Figure 1A:
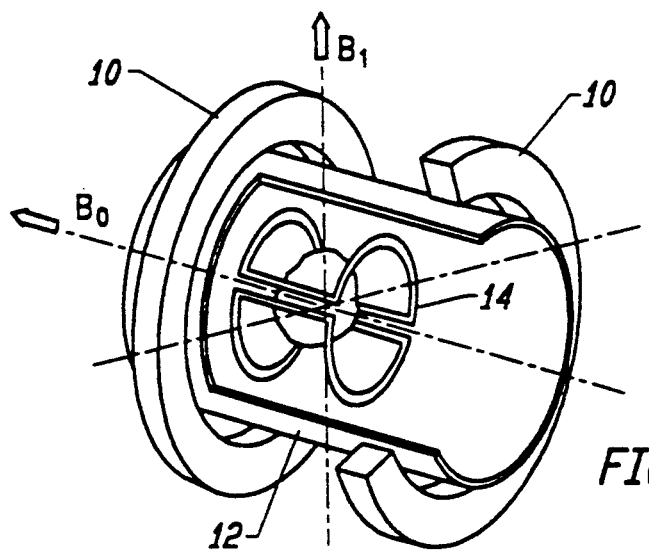
FIGS. 1A-1D illustrate the arrangement of conventional MRI apparatus and magnetic fields generated therein.
Figure 1B:
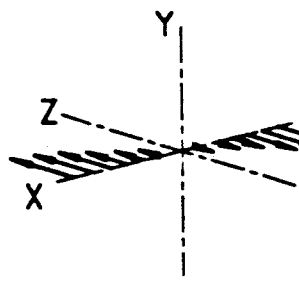
Figure 1C:
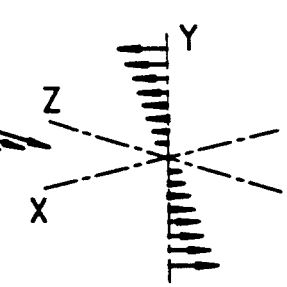
Figure 1D:
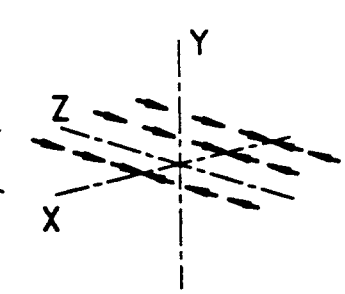

Referring now to the drawings, FIG. 1A is a perspective view partially in section illustrating coil apparatus in an NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338-350.

Briefly, the uniform static field $B_0$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y and Z axes. FIGS. 1C and 1D are similar representations of the Y gradient and Z gradient fields, respectively.

Figure 2:
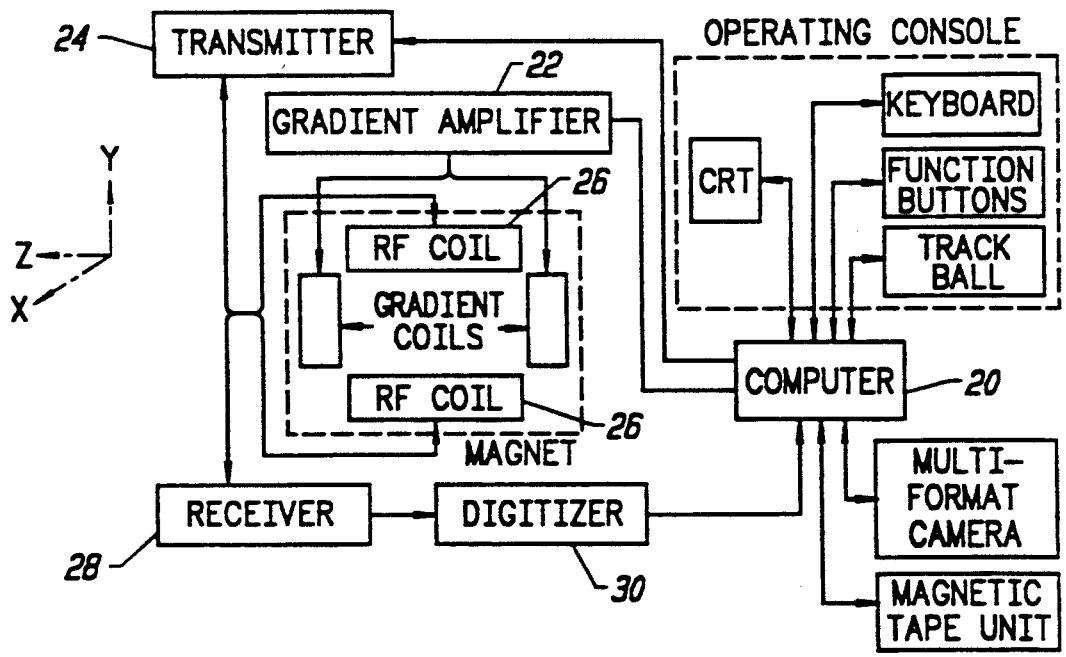
FIG. 2 is a functional block diagram of MRI imaging apparatus.

FIG. 2 is a functional block diagram of the imaging apparatus as disclosed in *NMR-A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

As noted above, water suppression throughout a large area of interest (ROI) in spectroscopic imaging is difficult due to $B_0$ and $B_1$ inhomogeneities, and intense lipid signals from subcutaneous fat surrounding the skull must be eliminated to avoid overwhelming the much smaller desired metabolite signals. Heretofore, a series of spatially selective RF pulses have been used to excite a limited rectangular region which is positioned to lie wholly in the brain.

In accordance with the invention, a new pulse sequence allows spectroscopic imaging of an entire slice through the brain. This sequence, shown in FIG. 3, uses inversion recovery to exploit the significant $T_1$ differences between lipids ($T_1 \approx 300$ ms) and the various metabolites (e.g. NAA, lactate, creatine, and choline all have $T_1$'s around 1500 ms). Adjusting the inversion time TI to null lipids produces significant fat suppression at the cost of only a modest reduction of the desired metabolite signals. Water suppression in the pulse sequence is achieved using a spectral-spatial 180° RF pulse. No ROI restrictions other than the slice selection are used. Thus the setup time usually needed for careful adjustment of the ROI is eliminated, which can be a considerable benefit in a typically lengthy spectroscopic imaging study. In addition, since all pulses are selective along the same axis, efficient multislice imaging may also be performed.

Figure 3:
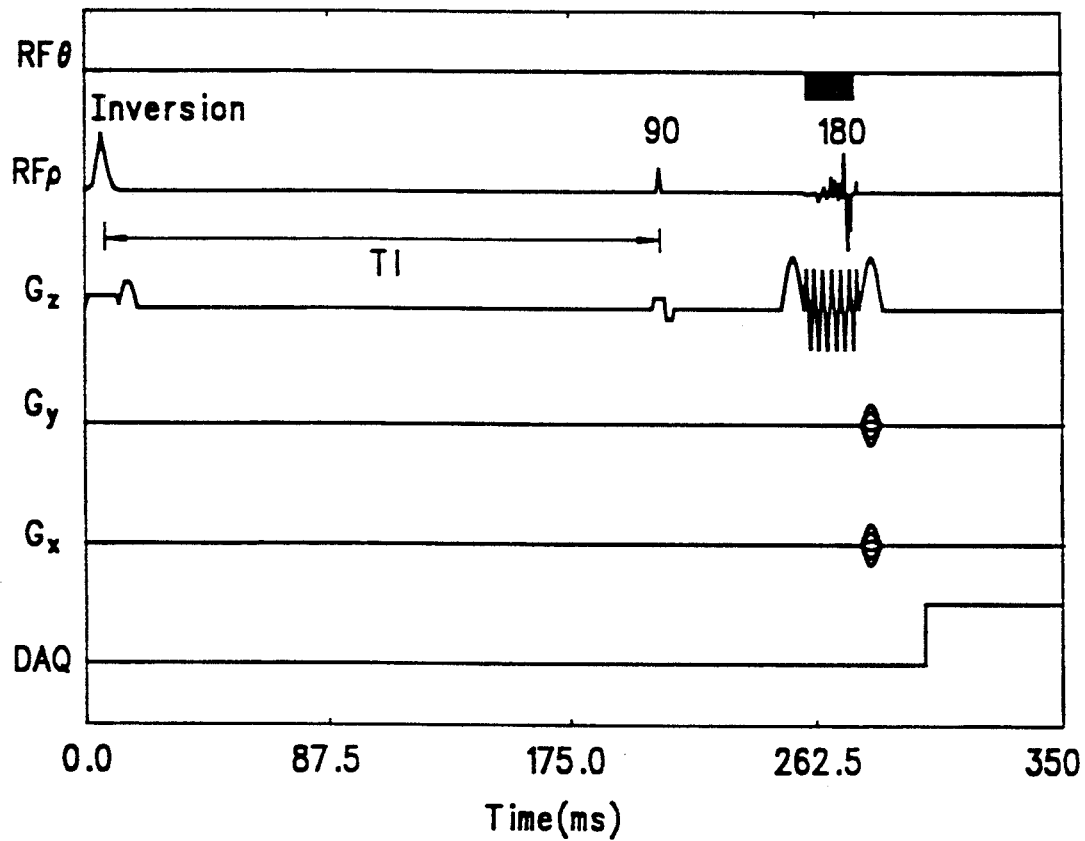
FIG. 3 illustrates the pulse sequence in selectively imaging in accordance with one embodiment of the invention.

The spectroscopic imaging pulse sequence shown in FIG. 3 consists of three RF pulses. An adiabatic 180° inversion pulse followed by an inversion time TI is used to suppress lipids using the known STIR technique. 90° and 180° RF pulses are then used to generate a spin echo from the desired slice. Water suppression is achieved using a two-dimensional spectral-spatial 180° refocusing pulse, and phase encoding along the x and y axes are used for 3DFT spectral localization.

Figure 4A:
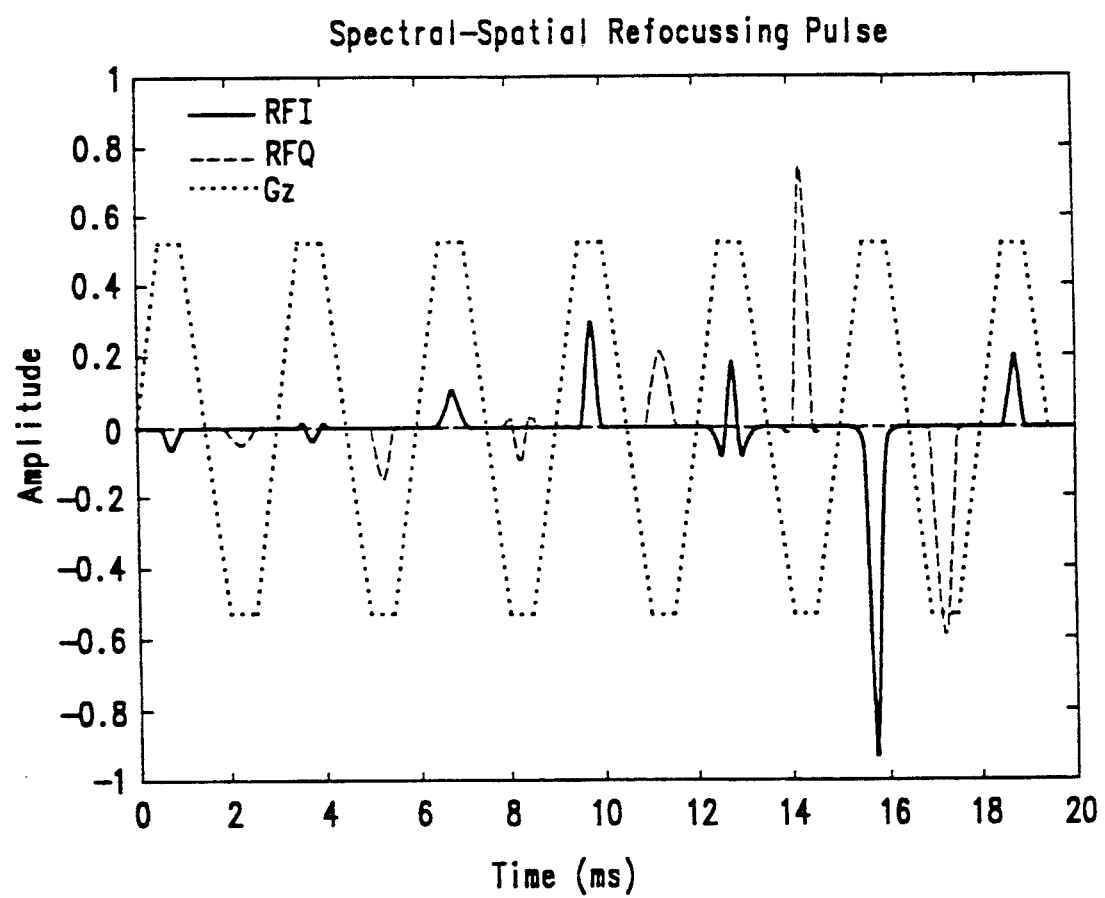
FIG. 4A illustrates RF and gradient waveforms for a minimum phase spectral-spatial 180° spin echo pulse in the pulse sequence of FIG. 3.
Figure 4B:
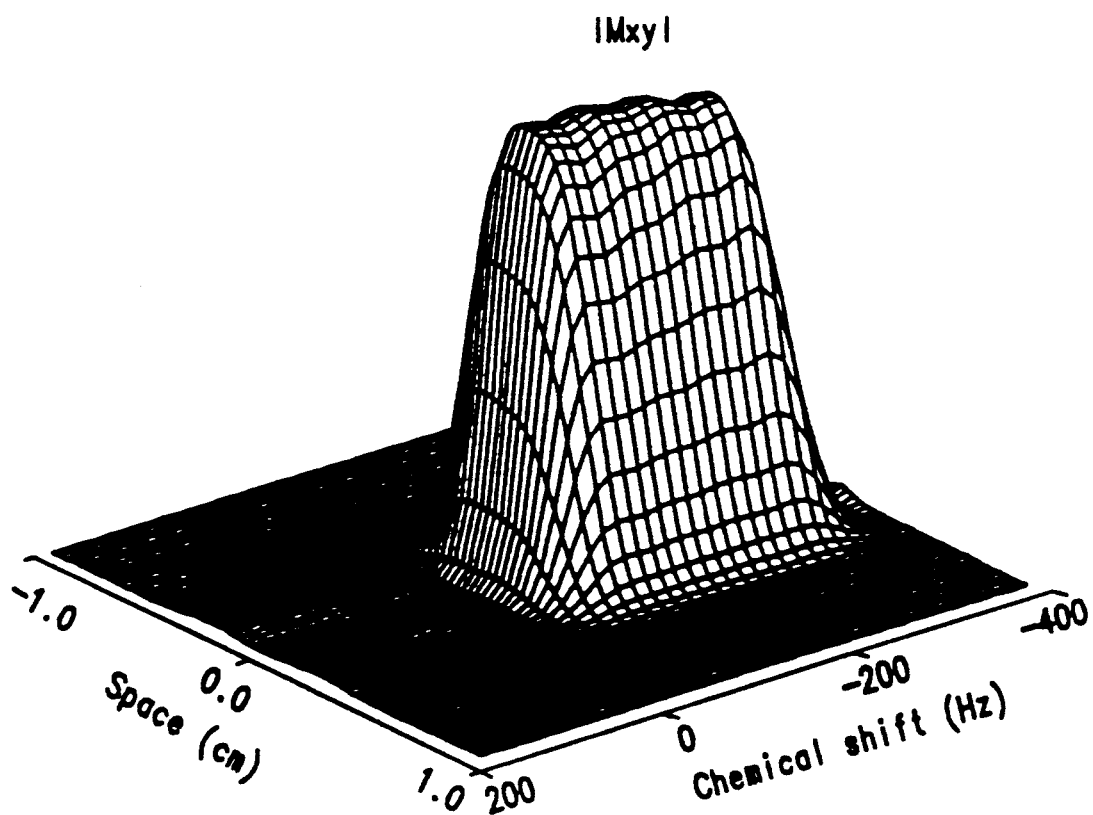
FIG. 4B illustrates the corresponding two dimensional slice profile; an FIG. 4C illustrates spectral profile showing the pass, stop, and transition bands.

The use of a 180° spin echo pulse which is simultaneously selective in spatial coordinates and chemical shift provides a convenient method of achieving water suppression while maintaining a multislice imaging capability by ensuring all RF pulses are spatially selective along the same axis. FIG. 4A shows the details of this refocussing pulse and the accompanying gradient waveform. The overall RF envelope essentially determines the spectral profile, and the shape of the RF subpulses determines the spatial response. The two-dimensional magnetization profile generated by this pulse is shown in FIG. 4B.

In one embodiment of the invention using a 1.5T GE Signa magnet, two important constraints dictated by hardware had to be met in designing this pulse. First, the gradients were limited to a maximum rise time of 1G in 600us. A trapezoidal waveform was chosen in order to always be at this slew rate limit. The second constraint was 20 ms maximum length RF pulse allowable on our RF amplifier. One of the primary goals of the pulse design process is to achieve a spectral passband (i.e. range of chemical shifts which are properly refocussed) extending from choline to lactate ($\approx 2$ ppm) while maintaining adequate water suppression. The overall pulse duration determines the minimum transition width between the pass and stop bands. For a fixed duration, a significant reduction in this transition band can be achieved with a non-linear phase pulse such as a minimum phase RF pulse as compared to a linear phase design. Thus a minimum phase (in the spectral dimension) design was chosen. However, other non-linear phase pulses can be used.

Figure 4C:
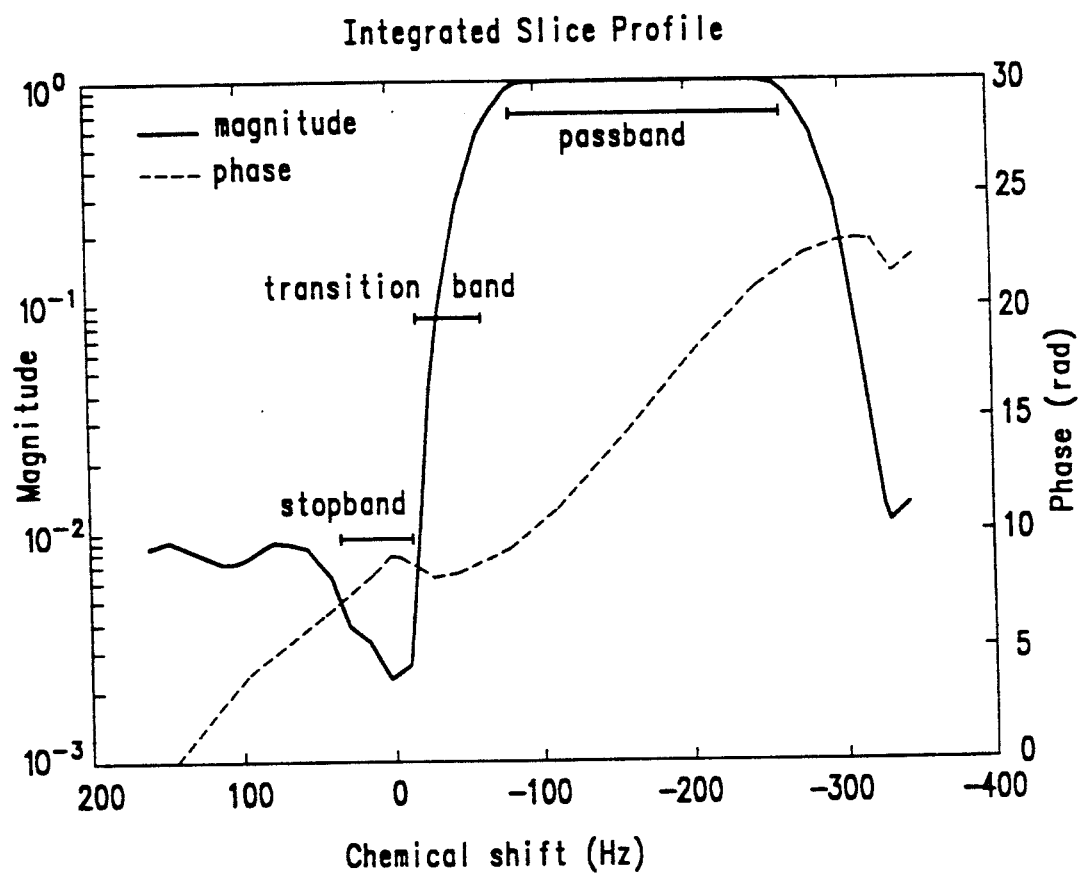

One consequence of the choice of a minimum phase RF pulse is a slightly non-linear phase profile along the chemical shift axis (the pulse has linear phase in the spatial direction), and the magnitude and phase profile of the pulse is shown in FIG. 4C. While the small degree of nonlinear phase results in no signal loss since we are resolving along the chemical shift axis, experiments requiring careful phasing of the spectra need to include this nonlinear phase profile. However, the phase profile is well characterized, and is thus easily incorporated into any post-processing algorithm.

Sensitivity to $B_0$ and $B_1$ inhomogeneities are an important consideration for spectroscopic imaging of large volumes in the human brain. Even with in vivo shimming and careful RF coil design, significant inhomogeneities remain. Robust pulse sequences must be designed to effectively deal with these imperfections.

The quality of water suppression achieved by a spectral-spatial 180° pulse is determined by the width and depth of the stopband. $B_0$ inhomogeneities cause the water peak to shift; thus, the width of the stopband determines robustness of the water suppression. For this pulse, we have chosen a stopband of 30 Hz which provides insensitivity to a reasonable range of main field variations. For systems with less stringent restrictions on the maximum RF pulse duration, longer pulses would allow a decreased transition band and correspondingly wider stop or pass bands. Linear phase pulses can also be used.

A common alternative water suppression method uses a water selective RF pulse and accompanying dephasing gradient. High quality water suppression using this method requires an accurate flip angle for the water selective pulse. Hence, this method is sensitive to RF inhomogeneities which can be especially troublesome when imaging a large ROI. By using a water suppression method, such as a spectral-spatial pulse in which only the desired metabolites are excited, a measure of immunity to $B_1$ inhomogeneities is achieved. Since the water is in the stopband, it receives essentially no excitation. RF inhomogeneities will only affect the signals in the passband to the degree seen in conventional imaging; thus the water suppression is relatively robust to the RF variations typically seen over the head.

Figure 5:
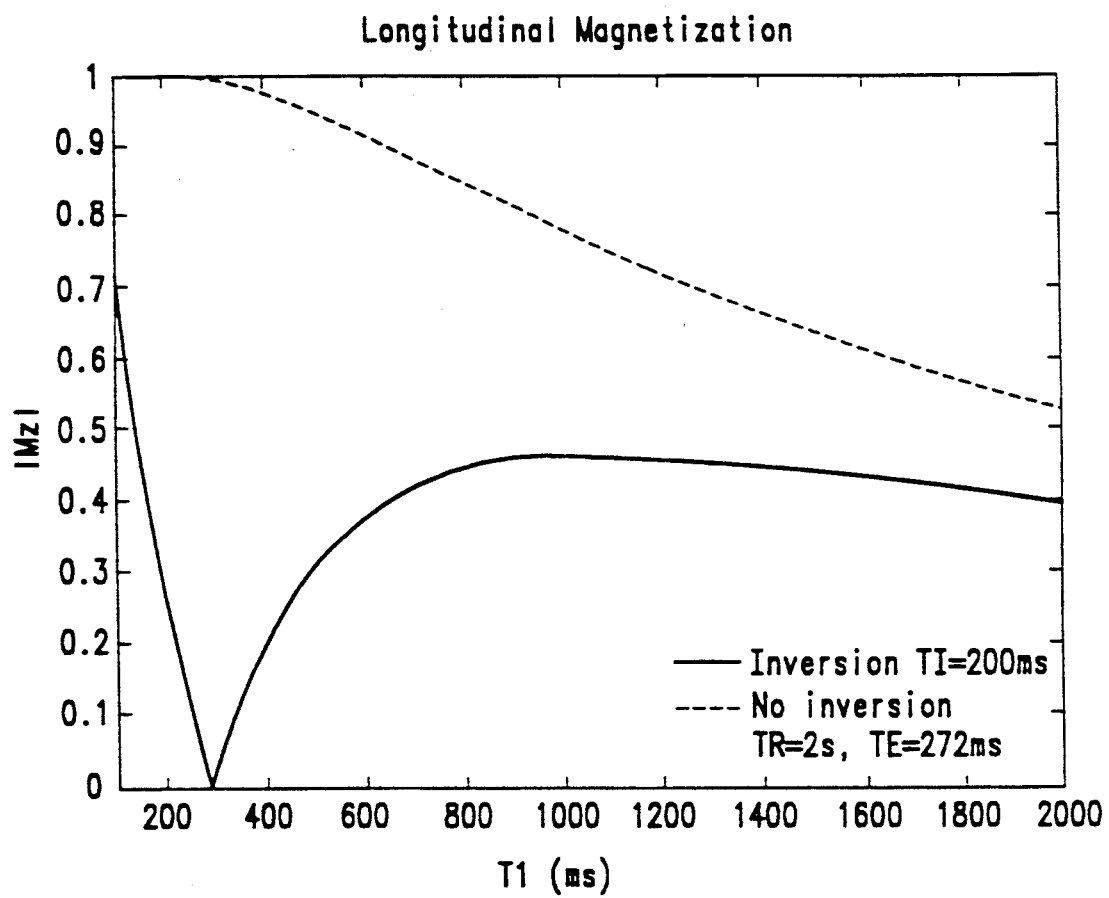
FIG. 5 is a plot of simulated magnetization for the pulse sequence of FIG. 3 with magnetization $|Mz|$ at the time of the 90° pulse plotted as a function of the T1 relocation times.

Inversion recovery is a well known method for obtaining $T_1$ discrimination. The pulse sequence shown in FIG. 3 uses an adiabatic hyperbolic secant inversion pulse to exploit the relatively short $T_1$ relaxation times of lipids. The inversion time is adjusted such that the 90° excitation pulse occurs when the lipid signal reaches a null, and an adiabatic pulse is used to gain immunity to $B_1$ inhomogeneities. FIG. 5 is a simulation of the longitudinal magnetization, $|M|$ (at the time of the 90° pulse), as a function of $T_1$. An inversion time of 200 ms was found to provide maximal lipid suppression. The optimal inversion time is a function of the steady state $M_z$ magnetization and is thus affected by the choice of repetition and echo times. Different repetition or echo times would require a slightly different inversion time to achieve the best fat suppression.

While inversion recovery provides significant lipid suppression, some signal from the desired metabolites will clearly be lost due to $T_1$ recovery during the inversion period. Simulations indicate that signal from metabolites with $T_1 = 1500$ ms will be reduced in amplitude by approximately 30% when a 200 ms inversion time is used.

Figure 6A:
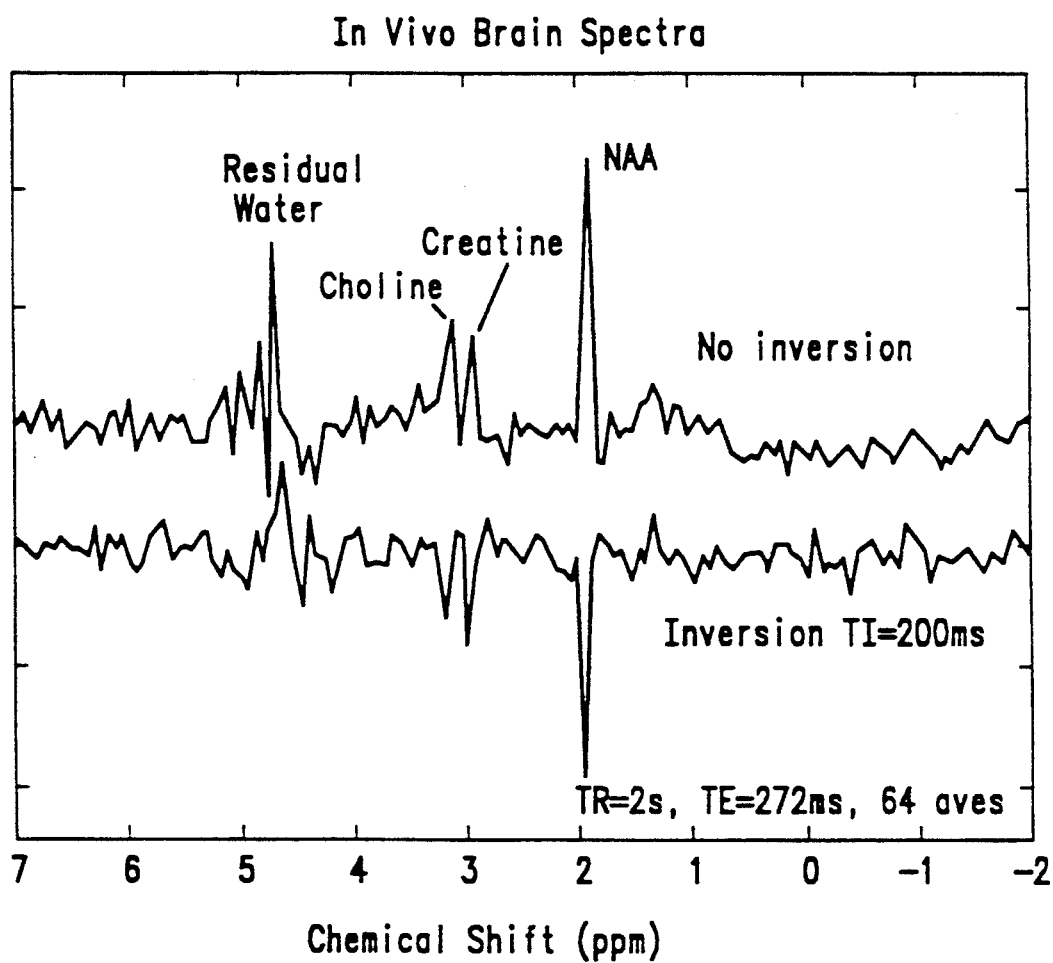
FIG. 6A is a plot of in vivo brain spectra with and without a preceding inversion pulse.

To fully analyze this signal loss, experiments were conducted using a PRESS sequence to excite an 8cc interior brain voxel localized well away from any subcutaneous fat. FIG. 6A shows the resulting spectra with and without a preceding inversion pulse. The NAA, creatine, and choline signals decrease in magnitude by approximately 27%.

Figure 6B:
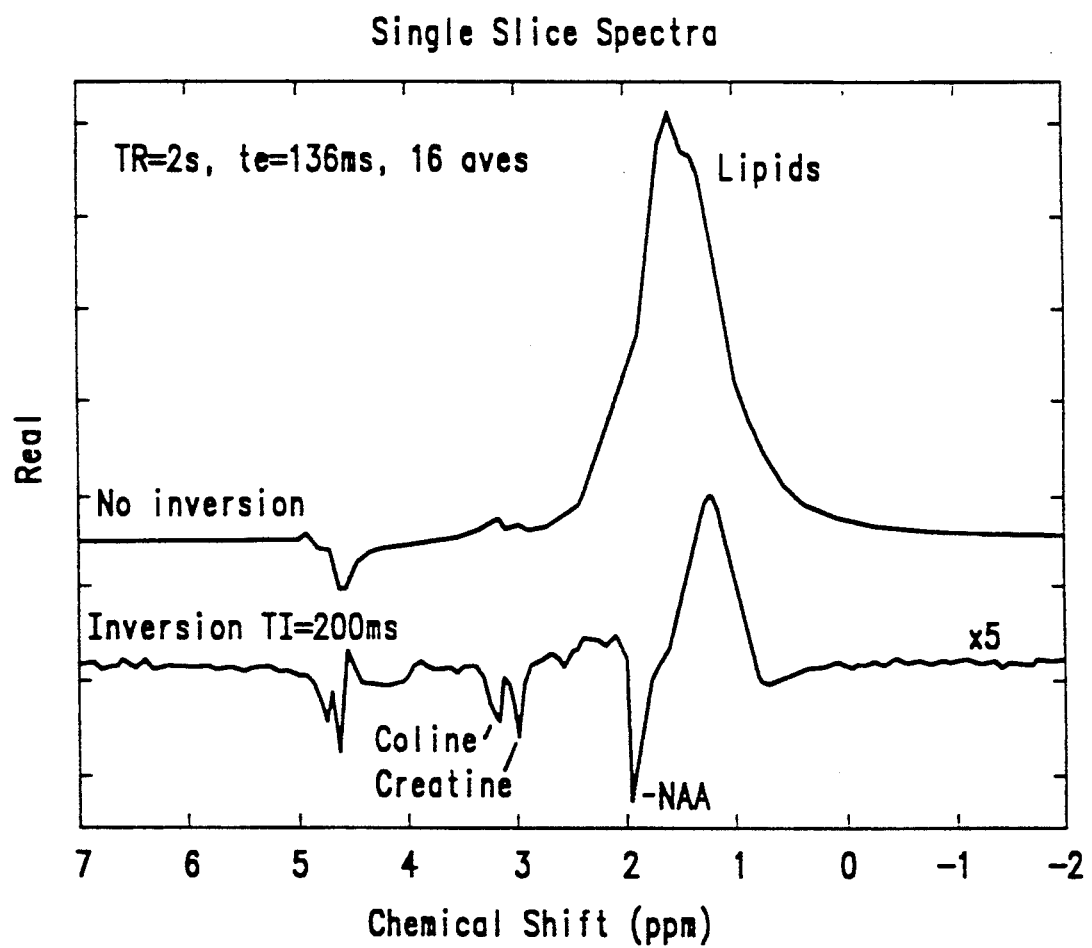
FIG. 6B illustrates spectra from an entire axial brain slice with and without an inversion pulse.

The degree of lipid suppression obtainable is illustrated in FIG. 6B which shows spectra from an entire axial slice (slice thickness = 1.5 cm) through a normal brain. The use of an inversion pulse allows clear observation of the NAA, creatine, and choline resonances.

Thus, using the STIR technique in proton brain spectroscopy experiments involves tradeoff between the loss of some signal due to finite metabolite $T_1$'s and the ability to image a larger ROI including tissue adjacent to the skull. Spectroscopic imaging of unrestricted axial brain slices is demonstrated in FIGS. 8 and 10-12, infra.

An alternative approach for addressing the problem of undesirable signal loss is use of a chemical shift selective inversion pulse to invert only the lipid section of the spectrum. Two-dimensional adiabatic pulses would be a reasonable choice if the desire to maintain multislice capabilities is an important consideration. However, considerable care must be taken to ensure that the transition band of the inversion pulse does not adversely affect the other spectral peaks such as NAA. An inversion pulse with sufficient selectivity to avoid distorting other spectral components would probably have to be over 20 ms in duration. This is particularly true of adiabatic pulses, which are known to have large time-bandwidth products. In addition, components, such as lactate, which are co-resonant with lipids would still suffer signal loss.

Following 3DFT acquisition, spectroscopic data sets are processed in order to produce images of the various metabolites. $B_0$ inhomogeneities present an important problem, especially when imaging large volumes in the brain. Even with in vivo shimming, spectra still suffer from inhomogeneities which induce shifts and distortions. In order to correct for these shifts, we have introduced and developed water referencing. This approach makes use of a field map generated from the frequency of the water signal in each voxel. Spectra from each voxel are thus shifted, using the field map information, in order to correct for $B_0$ variations across the field of view. When a field map is unavailable, the NAA signal can be used as an internal frequency reference. However, NAA referencing will fail in regions with low NAA signal; thus water referencing is preferable. Once intervoxel $B_0$ shifts have been removed, metabolite images can be formed by integration of the desired spectral peak in each voxel.

Another problem with metabolite brain images is that their low spatial resolution (typically on the order of 1 to 1.5 cm) can make visual correlation with brain anatomy difficult. We have found it useful to add to each metabolite image an edge enhanced version of the corresponding high resolution water image. This process is illustrated in FIG. 7 for a 16×16 NAA image collected using a PRESS sequence producing a rectangular ROI within the brain, 1.5×1.5×1.5 cm voxels with inversion recovery for lipid suppression.

Figure 7A:
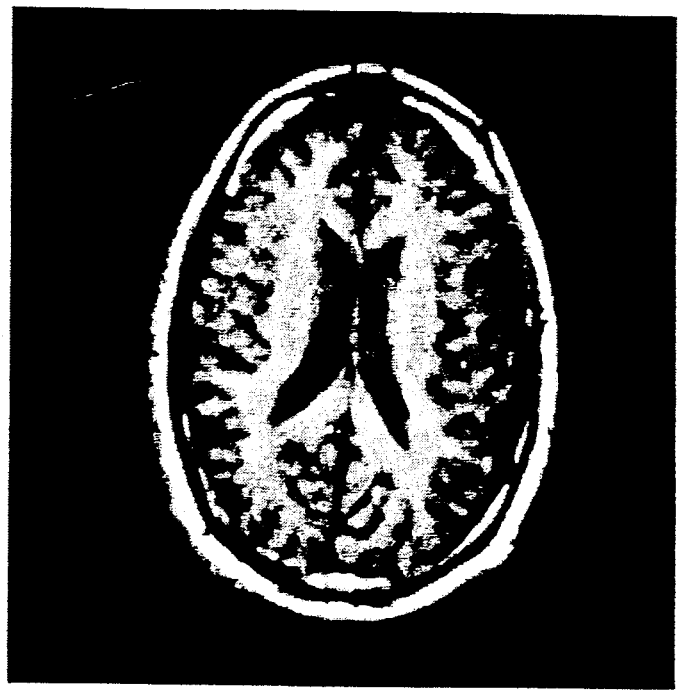
FIGS. 7A-7D are brain slice images illustrating prior art image processes.
Figure 7B:
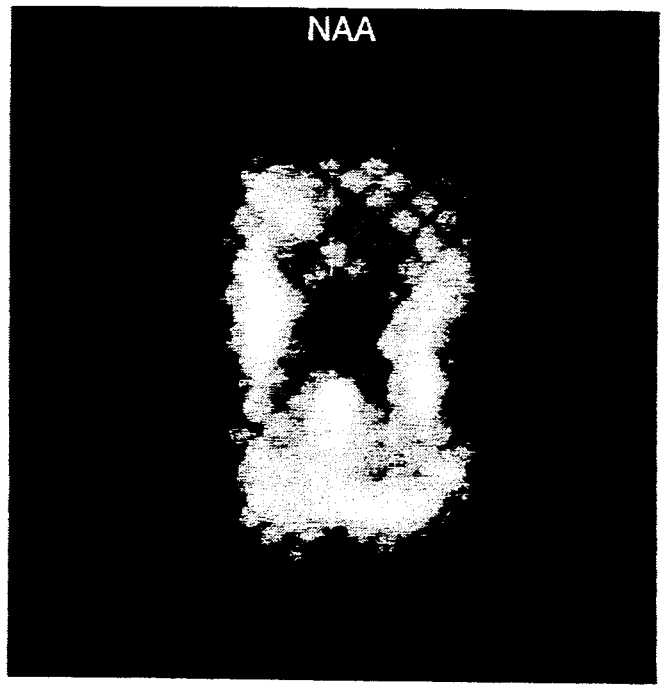
Figure 7C:
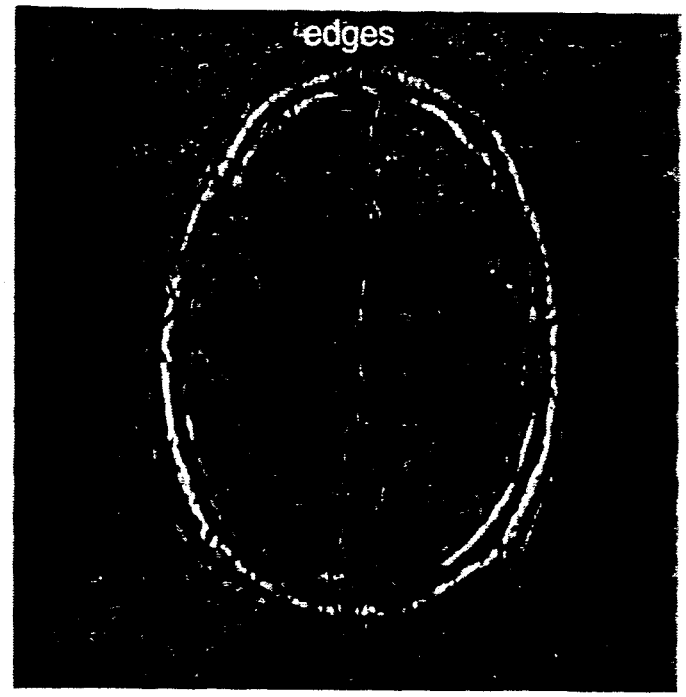
Figure 7D:
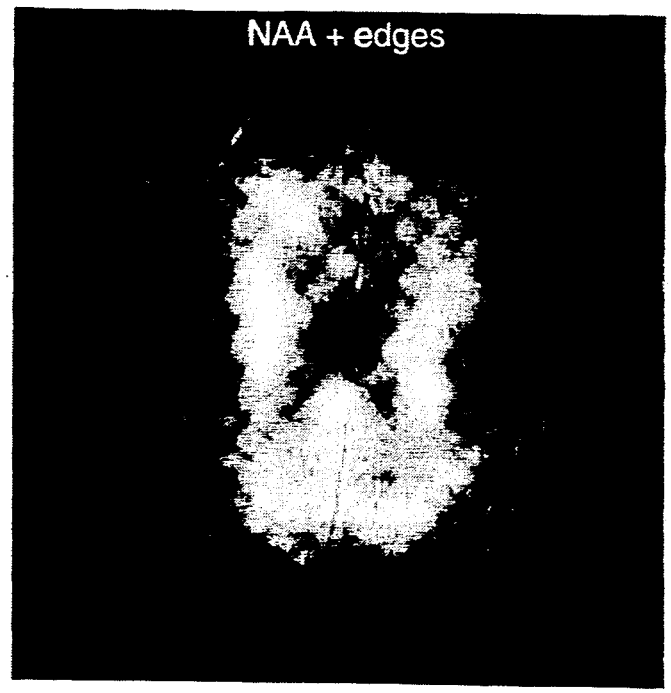
Figure 8A:
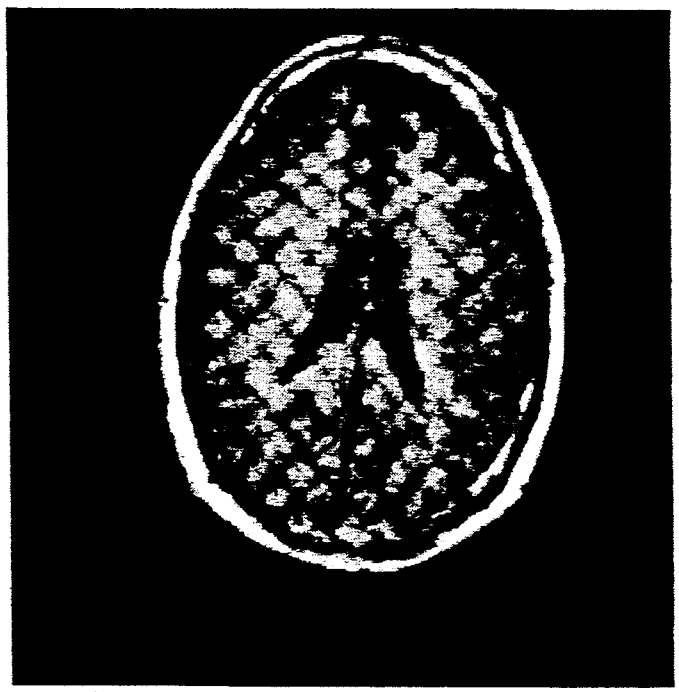
FIGS. 8A-8D are brain slice images illustrating image processing in accordance with the invention.
Figure 8B:
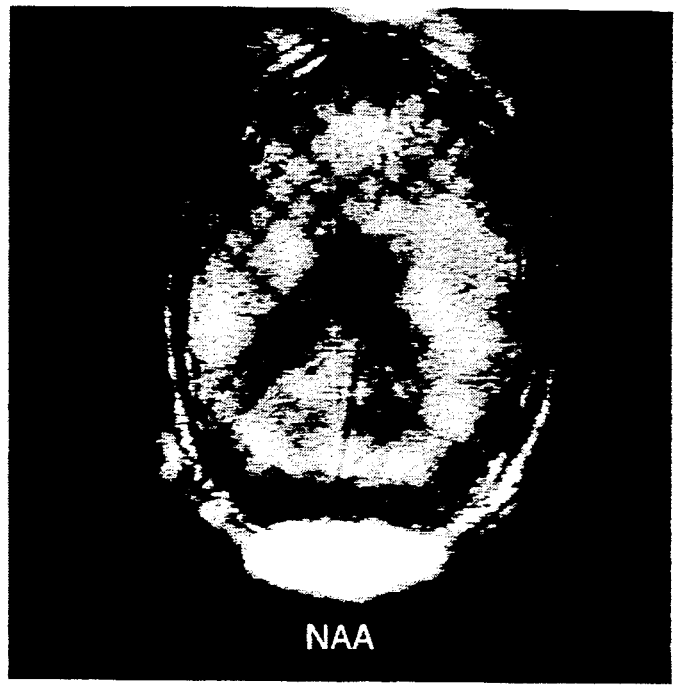
Figure 8C:
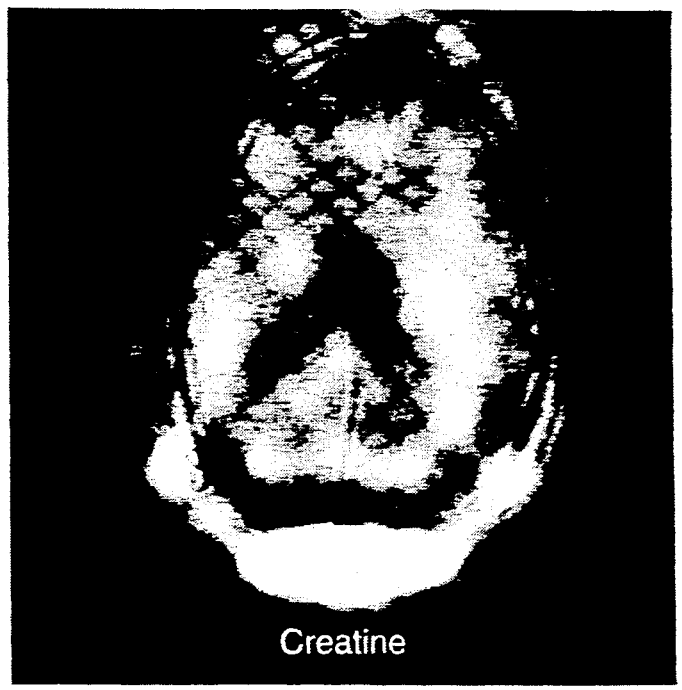
Figure 8D:
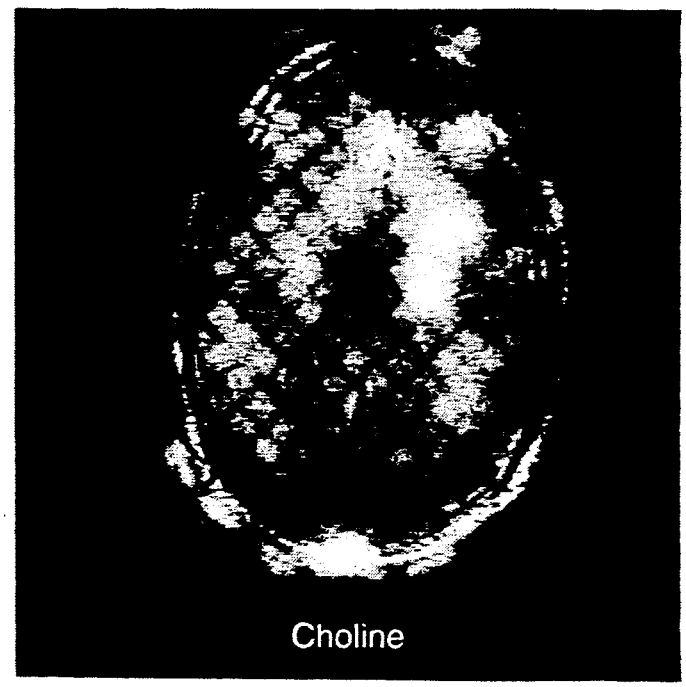

The 16×16 (or 32×32) metabolite images are first interpolated (bicubic interpolation) to 256×256. The corresponding conventional high resolution image is edge detected by convolution with a Laplacian kernel:

$$K = \begin{bmatrix} -1 & -1 & -1 \\ -1 & 8 & -1 \\ -1 & -1 & -1 \end{bmatrix}$$

and then added (with appropriate scaling so as to not obscure the spectroscopic data) to each metabolite image. As illustrated in FIG. 7C, the edge-detected water image provides a convenient anatomical reference. FIG. 7D is a linear combination of FIG. 7B and FIG. 7C.

A series of in vivo experiments were conducted on the 1.5T GE Signa magnet (with shielded gradients) to demonstrate the performance of the proposed spectroscopic imaging pulse sequence and data processing algorithms. The protocol for these studies was as follows: first, localization scans of the brain were collected in order to select the slice (or slices) of interest. In vivo shimming was then performed using a known automated shimming procedure. This method generates a 3-dimensional field map which is used by a least squares procedure to compute the optimal shim currents. Currents were computed for the linear gradients as well as five second order shims available on our resistive shim system (xy, $x^2-y^2$, zx, zy, and $z^2$). Shimming was performed on a 4 cm axial slab and typically achieved an rms field deviation of 3-8 Hz over this volume. The entire shimming procedure requires 1 minute to collect the field map, 2.5 minutes for the reconstruction, current calculations, and downloading of the new shim values, and is fully automated to eliminate the need for operator intervention. The following table illustrates the performance of this shimming technique and also gives comparable results when only the linear shims are used (many systems do not have higher order shims available):

| | In Vivo Head Shim | |
|---|---|---|
| Initial Shim | All Shims (8) | Linear Shims |
| 73.44 | 31.15 | 62.26 pp |

| Initial Shim | In Vivo Head Shim All Shims (8) | Linear Shims |
|---|---|---|
| 11.99 | 3.16 | 8.45 rms |
| | (Field deviations in Hz) | |

Following shimming, the spectroscopic data was collected using 3DFT localization. Since the water suppression is based solely on the spectral-spatial 180° pulse, the operator needs only to set the appropriate center frequency; no additional adjustments were needed. Similarly, an inversion time of 200 ms yielded sufficient lipid suppression so that no additionally fine tuning of TI was necessary. Echo times (TE) of 136 or 272 ms were used with a 2s repetition time (TR). A 17 minute acquisition time was used for 16×16 data sets (1.5 cm×1.5 cm×1.5 cm voxels). When sufficient time was available, a 34 minute acquisition time was used to collect 32×32 data sets with voxel volumes ranging from 1.2 to 0.8 cc.

Figure 9:
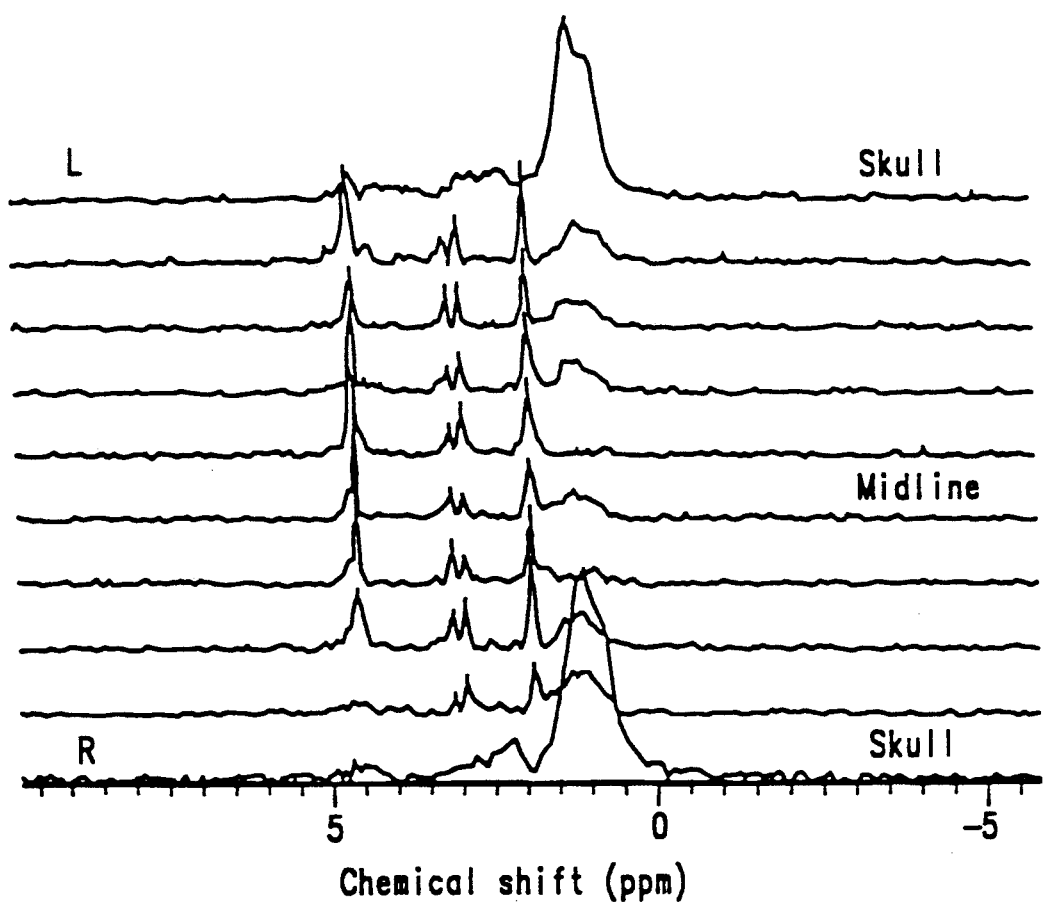
FIG. 9 illustrates in vivo spectra from the data set shown in FIG. 8A.
Figure 10A:
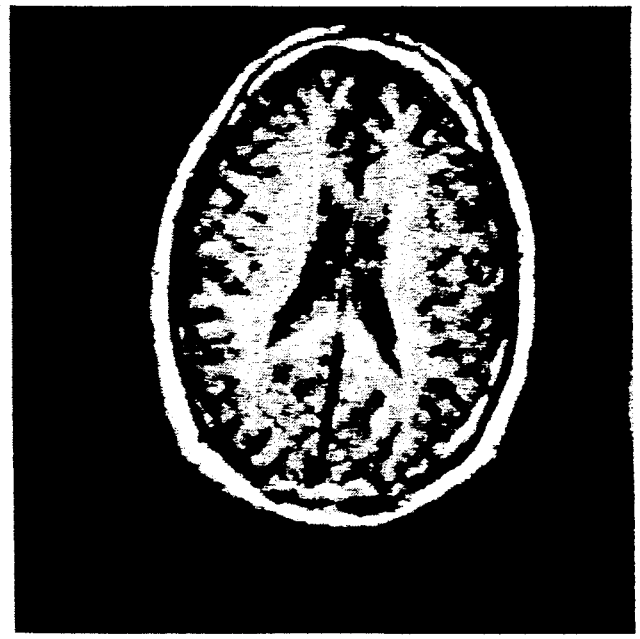
FIGS. 10A-10D illustrate metabolite images from a normal volunteer and a multiple sclerosis patient using the invention.
Figure 10B:
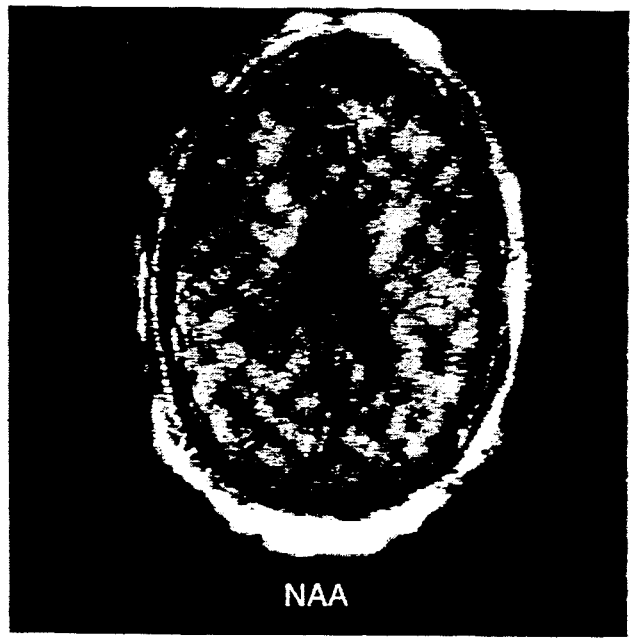
Figure 10C:
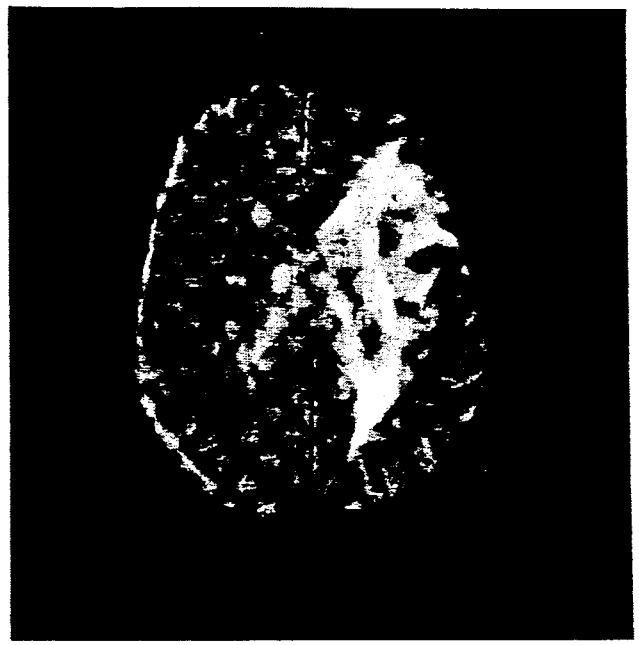
Figure 10D:
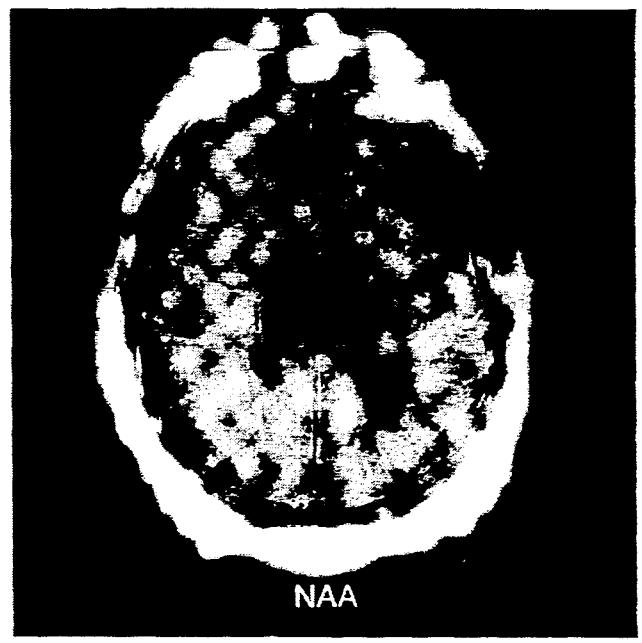
Figure 11A:
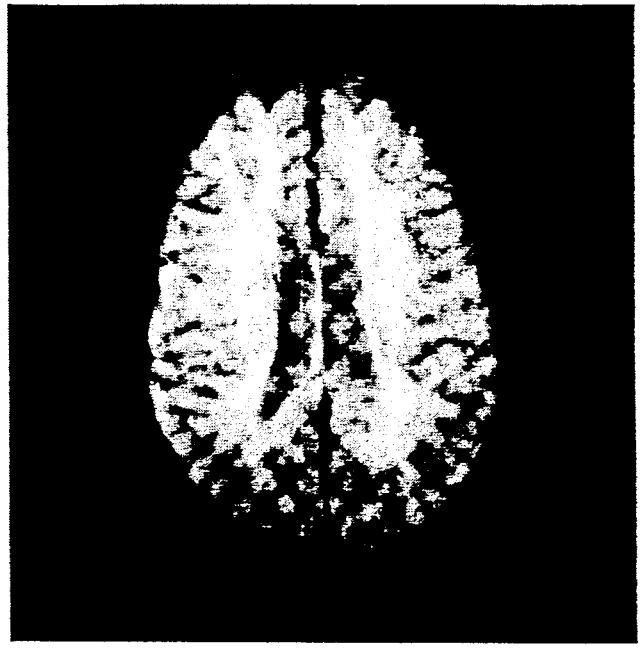
FIGS. 11A-11D illustrate multislice spectroscopic imaging in accordance with the invention.
Figure 11B:
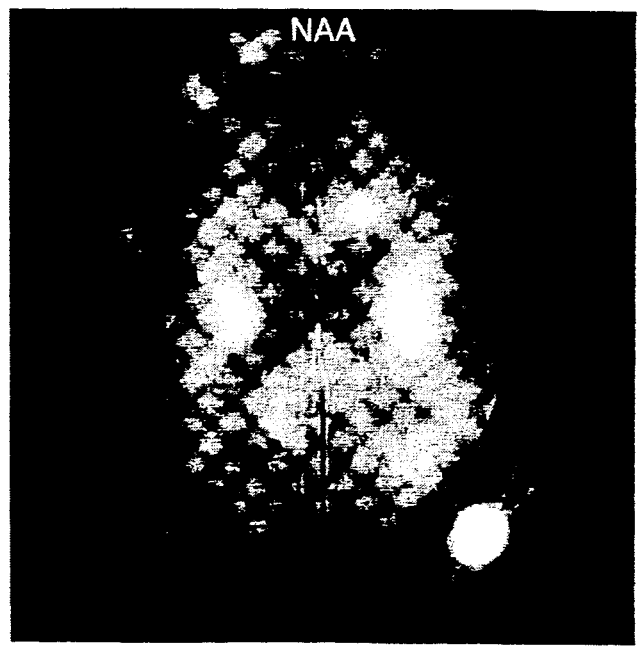
Figure 11C:
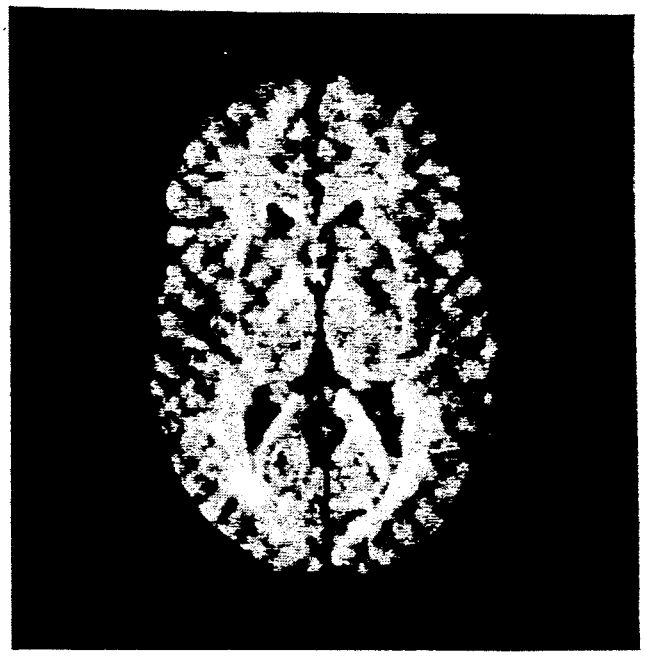
Figure 11D:
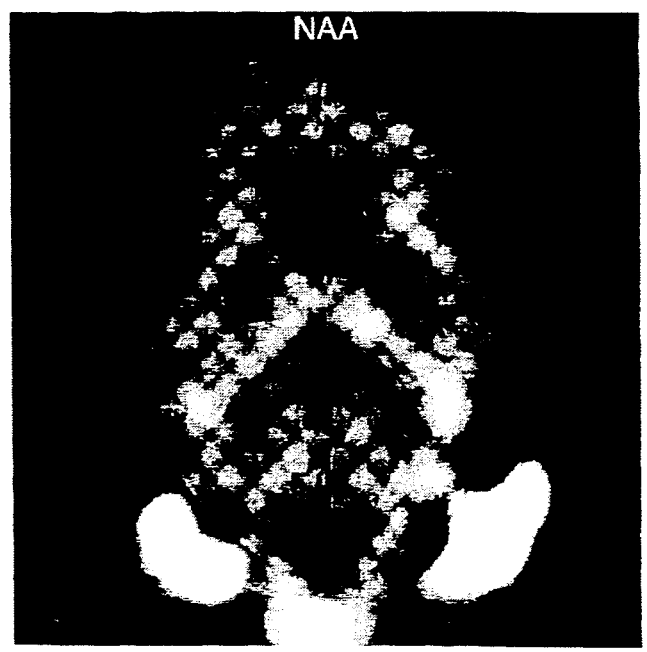
Figure 12A:
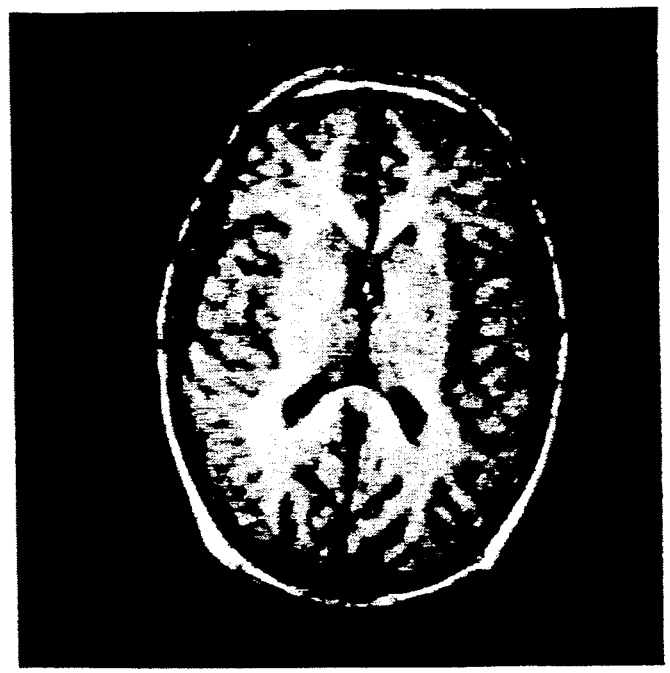
FIGS. 12A-12D illustrate spectroscopic images showing inhomogeneity artifacts.
Figure 12B:
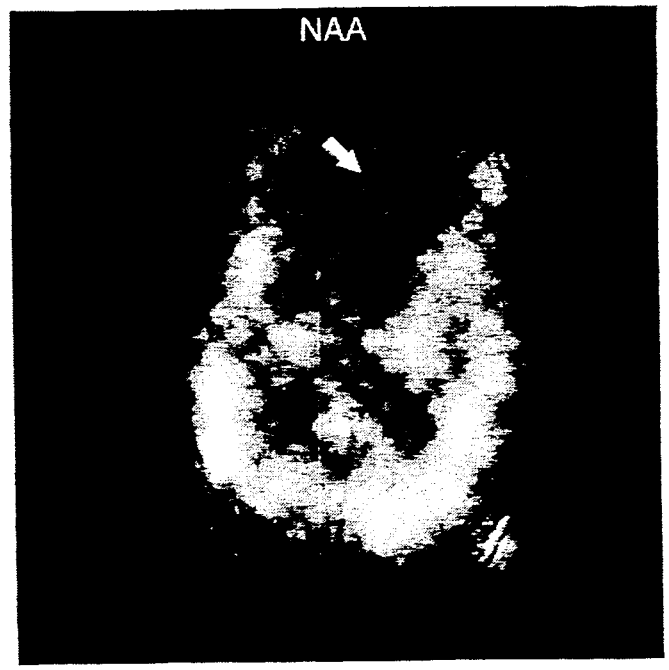
Figure 12C:
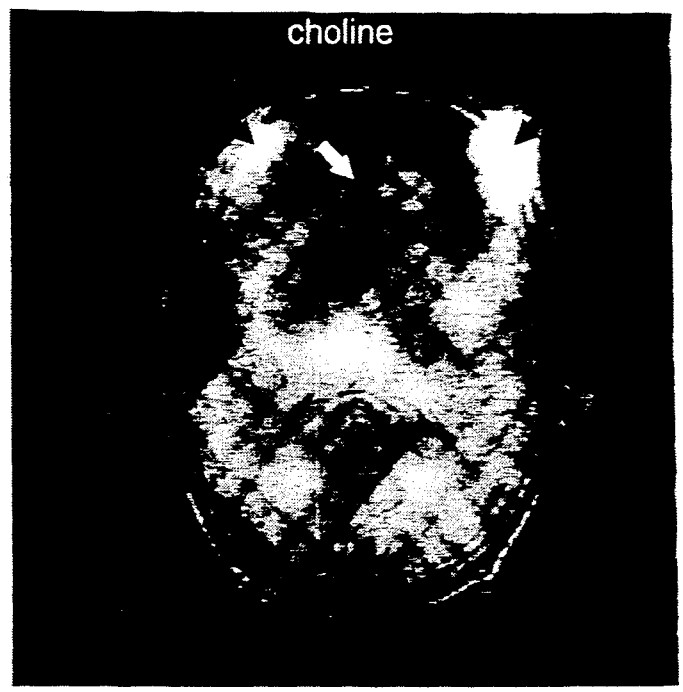
Figure 12D:
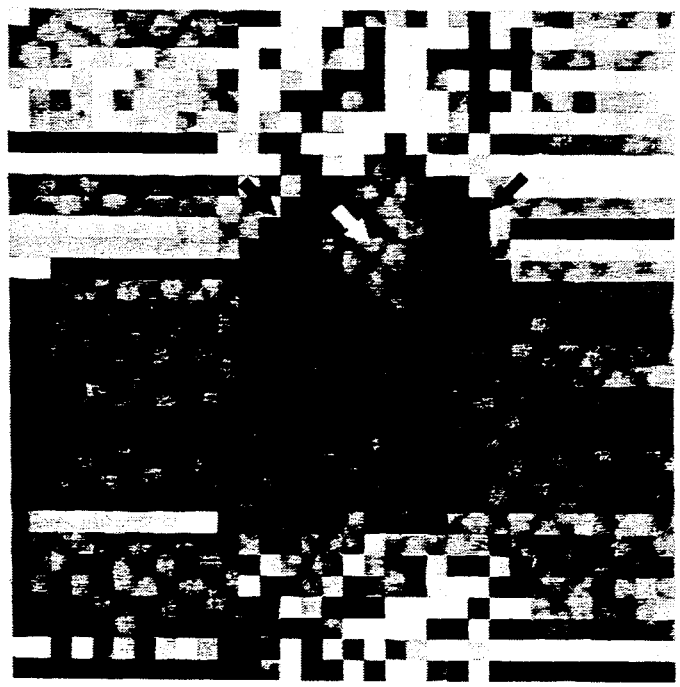

FIGS. 8A-8D show a brain slice and the NAA, creatine, and choline images from a normal volunteer. This 17 minute data set (TE=136 ms, TR=2s, 1.5× cm 1.5× cm× 1.5 cm voxels) shows that while fat signals are still present in the metabolic images, these artifacts are restricted regions to outside of the brain. This is evidenced by the spatially separation between the lipid artifacts and brain tissue and is also illustrated by the corresponding spectra shown in FIG. 9. The strongest lipid artifacts occur in areas of the skull where $B_0$ inhomogeneities cause significant spectral overlap of the residual lipid peak with the signals from the desired metabolites.

FIGS. 10A, 10B and FIGS. 10C, 10D show the results of 34 minute studies of a normal volunteer and a patient with multiple sclerosis, respectively. With the higher spatial resolution (i.e., improved spatial impulse response) of these studies, the lipid artifacts are even better localized well outside the brain. The NAA images show a clear signal decrease in the ventricles and, in the case of the MS patient, in the MS plaques.

Since all RF pulses in the sequence shown in FIG. 3 are selective along the z axis, multislice imaging can easily be performed. This greatly improves the time efficiency of imaging large volumes in the brain. With a TR=2s, TE=136 or 272 ms, and 256 to 512 ms data acquisition window, there is sufficient time to collect several slices. The primary limitation is the ability to shim over such a large region. Since we routinely shim over a 4 cm axial slab, imaging 2 or 3 1.5 cm slices is quite feasible. FIGS. 11A, 11B and FIGS. 11C, 11D illustrate this multislice spectroscopic imaging capability. NAA images are presented of 2 slices from a 17 minute spectroscopic study of a normal brain. These images show marked regional variations of NAA concentrations throughout the different anatomical structures in the brain.

The images presented in FIGS. 8, 10, and 11 demonstrate the ability to generate metabolic images of large volumes in the human brain. However, a fundamental limitation is the ability to uniformly shim over large regions. Given a finite number of shims with limited spatial distributions, a perfect in vivo shim is impossible. Areas of the brain near sinuses or other air cavities are particularly troublesome. These unshimmable inhomogeneities can produce image artifacts.

One effect is the loss of signal due to intravoxel dephasing. While bulk intervoxel shifts can be readily corrected by water or NAA referencing, it is harder to deal with dephasing within voxels. An example of such signal loss is illustrated in FIGS. 12A-12D where the white arrows indicate an area of significant inhomogeneity in the field map and corresponding signal drop outs in the metabolic images. There is measurable signal loss over much of the frontal lobe superior to the nasal cavity. One approach to address this problem is to increase the integration bandwidth used by the data processing algorithm whenever peaks are significantly broadened. A wider integration region will however result in noisier images and care must be taken to avoid errors from overlapping resonances. Information contained in the $B_0$ field maps can be used to optimally estimate the peak areas in each voxel by accurately tracking the inhomogeneity-induced line broadening.

If the inhomogeneities are sufficiently large, water suppression can also be adversely affected. As shown by the black arrows in FIGS. 12A-12D, the field shifts near the edge of the brain ($\approx$30 Hz) were sufficient to shift the water peak out of the stopband of the spectral-spatial 180° pulse. The resulting poor water suppression is manifested as bright artifacts in the choline image.

Thus, considerable care must be used when viewing spectroscopic images of the brain. Perhaps the best approach is to include a field map along with the metabolic images in order to alert the viewer to areas of potential problems. The field map information may aid the clinician in distinguishing true signal dropouts or hot spots from inhomogeneity artifacts.

There are also limitations associated with the use of inversion recovery for lipid suppression. The degree of obtainable lipid suppression is limited. Since all lipids do not have precisely the same $T_1$, perfect fat suppression cannot be achieved with a single inversion pulse. The use of multiple inversion pulses may improve the lipid suppression, but care must be taken to minimize the loss of desired metabolite signals. Another consideration is that the $T_1$ weighting produced by the inversion pulse may complicate efforts toward absolute metabolite quantification. Finally, the proposed imaging methods are not appropriate for all proton spectroscopic brain studies. In particular, it is sometimes desirable to observe lipids within the brain which may be present due to various pathological conditions. Using inversion recovery techniques, signals from these lipids, or indeed any species with $T_1$'s close to lipids, will be suppressed.

There has been described an inversion recovery sequence which can eliminate the need for spatially selective RF pulses typically used to restrict the ROI (and hence suppress signal from subcutaneous fat) in $^1H$ brain spectroscopic imaging. A spin echo pulse sequence is presented which allows for spectroscopic imaging of an entire slice through the brain. The spectral-spatial 180° pulse used for water suppression and the choice of an adiabatic 180° pulse for lipid suppression provides insensitivity to a reasonable range of $B_0$ and $B_1$ inhomogeneities.

Advantageously, metabolic images covering large volumes of the brain (including tissue adjacent to the skull) can be produced. Efficient multislice spectroscopic imaging is also demonstrated. Another application is the use of concentration standards. The elimination of spatially restrictive RF pulses permits external standards to be placed next to the patient's head during the examination, thus aiding absolute quantification of spectra.

While the invention has been described with reference to specific embodiments and applications, the description is illustrative of the invention and is not to be construed as limiting the invention. Various modifications and applications may occur to those skilled in the art without departing from the true spirit and scope of the invention as defined by the appended claims.

What is claimed is:

1. A method of selectively imaging a two dimensional slice through an object with suppression of short $T_1$ species water components comprising the steps of:
   (a) placing said object in a magnetic field ($B_0$) along one axis (z) thereby aligning nuclear spins in the slice along said axis;
   (b) applying an 180° RF inversion pulse to invert nuclear spins in said slice by 180°;
   (c) applying a 90° RF pulse to nuclear spins in said slice after a time period after step (b) which is correlated to the spin-lattice relaxation time ($T_1$) of said short $T_1$ species such that the nuclear spins of said short $T_1$ species have relaxed to a magnetic null;
   (d) applying a 180° RF pulse to nuclear spins in said slice which is spectrally and spatially selective of selected nuclear spins in said slice and suppresses nuclear spins of water in said slice;
   (e) detecting spin echo signals from said selected nuclear spins; and
   (f) generating a two dimensional image using the detected spin echo signals.

2. The method as defined by claim 1 wherein step (d) includes applying RF sub-pulses during application of a magnetic gradient ($G_z$) with the sub-pulse envelope determining the spectral profile and the shape of the sub-pulses determining spatial response.

3. The method as defined by claim 2 wherein step (e) includes applying magnetic gradients ($G_x$, $G_y$) along two axes (x,y) for phase encoding of said spectrally and spatially selective nuclear spins.

4. The method as defined by claim 3 wherein steps (c) and (d) include frequency modulating said 90° RF pulse and said 180° RF pulse for multiple slice imaging.

5. The method as defined by claim 1 wherein step (d) includes applying RF sub-pulses during application of a magnetic gradient ($G_z$) with the sub-pulse envelope determining the spectral profile and the shape of the sub-pulses determining spatial response.

6. The method as defined by claim 1 wherein steps (c) and (d) include frequency modulating said 90° RF pulse and said 180° RF pulse for multiple slice imaging.

7. The method as defined by claim 1 wherein step (d) includes applying a 180° non-linear phase RF pulse.

8. The method as defined by claim 1 wherein said object is a human brain and said selected nuclear spins are metabolites.

9. Apparatus for the selective imaging of a two dimensional slice through an object and suppressing water components and short $T_1$ species comprising:
   means for generating a magnetic field ($B_0$) along one axis (z) through said object thereby aligning nuclear spins in said slice along said axis;
   means for applying a 180° RF inversion pulse to invert nuclear spins in said slice;
   means for applying a 90° RF pulse to nuclear spins in said slice at a time period after application of said 180° RF inversion pulse which is correlated to the spin-lattice relaxation time ($T_1$) of said short $T_1$ species such that the nuclear spins of said short $T_1$ species have relaxed to a magnetic null;
   means for applying a 180° RF pulse to nuclear spins in said slice which is spectrally and spatially selective of selected nuclear spins in said slice and suppresses nuclear spins of water; and
   means for detecting spin echoes from the spectrally and spatially selective nuclear spins.

10. The apparatus as defined by claim 9 wherein element (c) applies a 180° non-linear phase RF pulse including RF sub-pulses having an envelope determining the spectral profile with the shape of said sub-pulses determining spatial response.

11. The apparatus as defined by claim 10 wherein element (d) includes means for applying magnetic gradients ($G_x$, $G_y$) along two axes (x,y) for phase encoding of said spectrally and spatially selective nuclear spins.

* * * * *